(12) United States Patent
Zang et al.

(10) Patent No.: US 11,282,886 B2
(45) Date of Patent: Mar. 22, 2022

(54) PIXEL, ASSOCIATED IMAGE SENSOR, AND METHOD

(71) Applicant: OmniVision Technologies, Inc., Santa Clara, CA (US)

(72) Inventors: Hui Zang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 59 days.

(21) Appl. No.: 16/711,239

(22) Filed: Dec. 11, 2019

(65) Prior Publication Data

US 2021/0183937 A1 Jun. 17, 2021

(51) Int. Cl.
*H01L 27/146* (2006.01)

(52) U.S. Cl.
CPC .. *H01L 27/14643* (2013.01); *H01L 27/14605* (2013.01); *H01L 27/14683* (2013.01)

(58) Field of Classification Search
CPC ........... H01L 27/14607; H01L 27/1461; H01L 27/14601
See application file for complete search history.

(56) References Cited

U.S. PATENT DOCUMENTS

| 8,614,759 | B2 * | 12/2013 | Watanabe | ......... | H01L 27/14887 348/315 |
| 2011/0089311 | A1 * | 4/2011 | Venezia | ............ | H01L 27/14603 250/208.1 |
| 2013/0175582 | A1 * | 7/2013 | Ihara | ................. | H01L 27/14612 257/222 |
| 2014/0273327 | A1 * | 9/2014 | Nakamura | .......... | H01L 27/1464 438/57 |
| 2016/0013240 | A1 * | 1/2016 | Jung | ................. | H01L 27/14627 257/292 |
| 2021/0280629 | A1 * | 9/2021 | Koga | ................ | H01L 27/14614 |

FOREIGN PATENT DOCUMENTS

| CN | 112397532 A | * | 2/2021 | | |
| WO | WO-2021015011 A1 | * | 1/2021 | ........... | H01L 27/146 |

* cited by examiner

*Primary Examiner* — David A Zarneke
(74) *Attorney, Agent, or Firm* — Lathrop GPM LLP

(57) ABSTRACT

A pixel includes a semiconductor substrate, an upper surface thereof forming a trench having a trench depth relative to a planar region of the upper surface surrounding the trench, and in a plane perpendicular to the planar region; an upper width between the planar region and an upper depth that is less than the trench depth; and a lower width, between the upper depth and the trench depth, that is less than the upper width. A floating diffusion region adjacent to the trench extends away from the planar region to a junction depth exceeding the upper depth and is less than the trench depth. The photodiode region in the substrate includes a lower photodiode section beneath the trench and an upper photodiode section adjacent to the trench, beginning at a photodiode depth that is less than the trench depth, extending toward and adjoining the lower photodiode section.

15 Claims, 6 Drawing Sheets

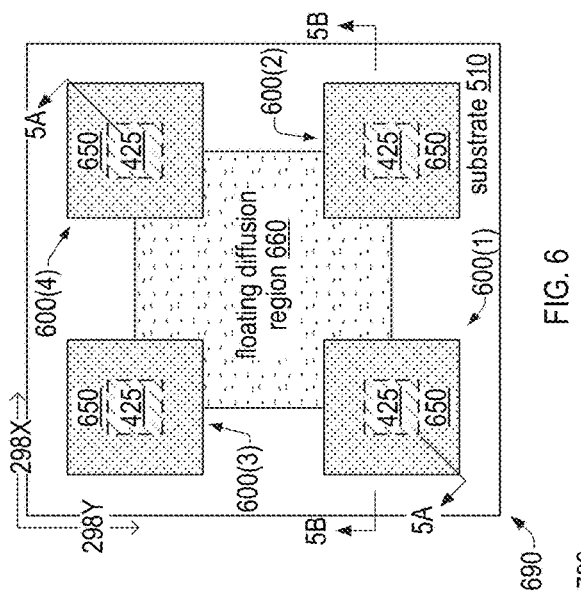
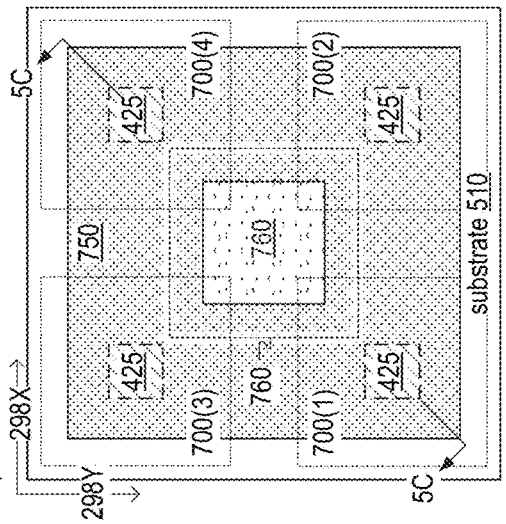
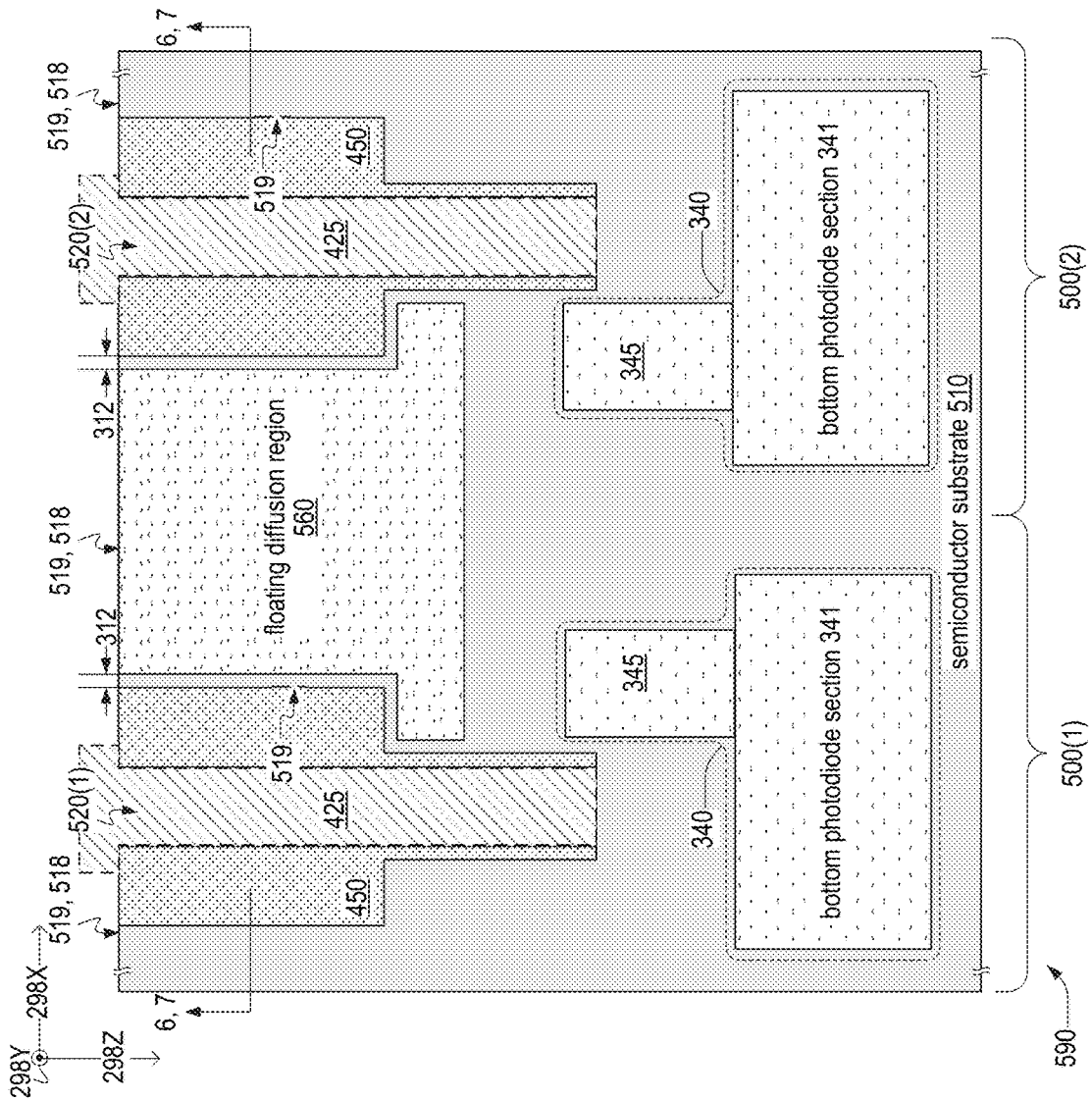

PIXEL, ASSOCIATED IMAGE SENSOR, AND METHOD

BACKGROUND

Camera modules in commercial products such as stand-alone digital cameras, mobile devices, automotive components, and medical devices include an image sensor and a pixel array thereof. The pixel array includes a plurality of pixels. A pixel array's pixel density is the number of pixels per unit area on the image sensor. In operation, the lens of a camera module forms an image, on the image sensor, of an object in its field of view. The object can be viewed a plurality of infinitesimally small point-sources of illumination—"impulses"—incident on the camera. The lens images each of the plurality of impulses at a plane of the pixel array as a respective one of a plurality of point-spread functions—"impulse responses." The resolution of images captured by the image sensor depends in part on pixel size compared to the size of the impulse response. Accordingly, one way to increase a camera's maximum attainable resolution is to increase pixel density by decreasing pixel size. Motivation to decrease pixel sizes has led to development of pixels with vertical transfer gates.

Each pixel of the plurality of pixels includes a photodiode region, a floating diffusion region, and a transfer gate. The transfer gate controls current flow from the photodiode region to the floating diffusion region and may be part of a field-effect transistor. The electric potential of the photodiode region exceeds that of the floating diffusion region. Light reaching the photodiode region generates photoelectrons. Turning on the transfer gate forms a conducting channel that allows the accumulated photoelectrons to transfer or flow from photodiode region to the floating diffusion region. When the transfer gate is pulsed to an off-state, the potential barrier is higher than that of the photodiode region, hence preventing photoelectrons from flowing to the floating diffusion region.

In one common pixel architecture, the photodiode and the floating diffusion region are laterally displaced within the pixel, in a lateral direction parallel to a plane of the pixel array, with the transfer gate therebetween. This plane is horizontally orientated with respect to the vertical direction perpendicular thereto that defines the direction of normally-incident reaching the pixel array. Such a horizontal orientation limits how much the pixel density can be decreased. Hence, one way to increase pixel density is to orient the photodiode, transfer gate, and floating diffusion in a direction that has a vertical component. Such transfer gates are examples of vertical transfer gates.

SUMMARY OF THE EMBODIMENTS

While vertical transfer gates enable increased pixel density, pixels with vertical transfer gates are vulnerable to an image artifact known as blooming. Blooming occurs when photogenerated charge in pixel saturate the pixel by exceeding the pixel's full-well capacity, and blooms over to adjacent pixels. Excess photoelectrons generated by the saturated pixel are collected by adjacent pixels, which affects sensitivity of the adjacent pixels. Blooming increases as the distance between the pixel's photodiode and its floating diffusion region increases, for example, when this distance exceeds a distance to a neighboring pixel. Embodiments disclosed herein ameliorate this problem.

In a first aspect, a pixel includes a semiconductor substrate, a floating diffusion region, and a photodiode region. The semiconductor substrate has a substrate upper surface forming a trench extending into the semiconductor substrate. The trench has a (i) trench depth relative to a planar region of the substrate upper surface surrounding the trench, and in a cross-sectional plane perpendicular to the planar region and in a direction parallel to the planar region (ii) an upper width between the planar region and an upper depth that is less than the trench depth, and (iii) a lower width, between the upper depth and the trench depth, that is less than the upper width. The floating diffusion region is in the semiconductor substrate, adjacent to the trench and extends away from the planar region to a junction depth, relative to the planar region, that exceeds the upper depth and is less than the trench depth. The photodiode region is in the semiconductor substrate and includes (i) a lower photodiode section beneath the trench and (ii) an upper photodiode section adjacent to the trench, beginning at a photodiode depth that is less than the trench depth, extending toward and adjoining the lower photodiode section.

In a second aspect, a method for forming a pixel includes forming a wide trench in a semiconductor substrate and ion-implanting a floating-diffusion region in the semiconductor substrate between the planar top surface and a junction depth in the semiconductor substrate. The wide trench has an upper depth with respect to a planar top surface of the semiconductor substrate. The floating-diffusion region has, in a cross-sectional plane perpendicular to the planar top surface, (i) an upper width between the planar top surface and the upper depth, and (ii) between the upper depth and the junction depth, a lower width that exceeds the upper width. Part of the floating-diffusion region is beneath the wide trench and between the upper depth and the junction depth.

BRIEF DESCRIPTION OF THE FIGURES

FIGS. 5 and 6 are respective schematic cross-sectional views of part of an image sensor that includes the pixel of FIG. 4, in an embodiment.

FIG. 7 is a cross-sectional view of an image sensor, which is an example of the image sensor of FIGS. 5 and 6, in an embodiment.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The term semiconductor substrate may refer to substrates formed using semiconductors such as silicon, silicon-germanium, germanium, gallium arsenide, and combinations thereof. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1:
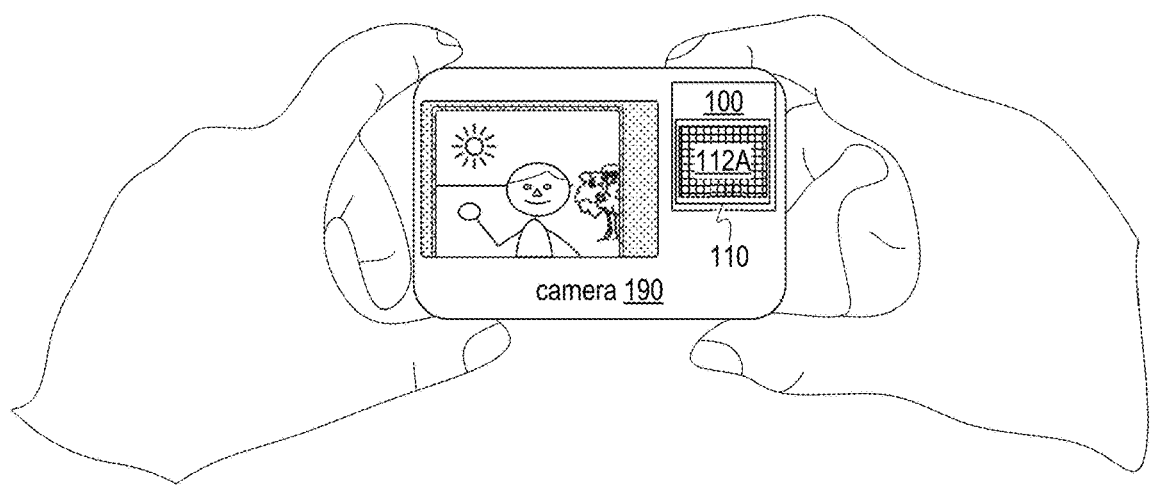
FIG. 1 depicts a camera imaging a scene.

FIG. 1 depicts a camera 190 imaging a scene. Camera 190 includes an image sensor 100, which includes a semiconductor substrate 110. Constituent elements of semiconductor substrate 110 may include at least one of silicon and germanium. Semiconductor substrate 110 includes a pixel array 112A. Image sensor 100 may part of a chip-scale package or a chip-on-board package.

Figure 2A:
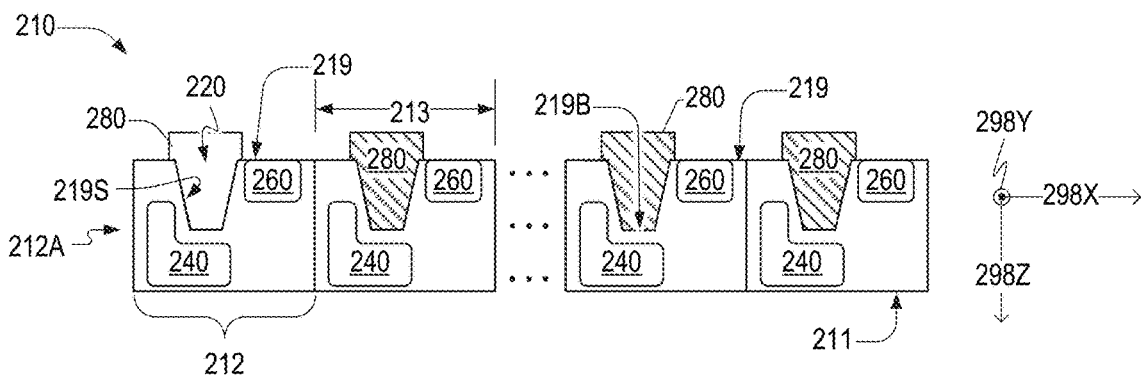
FIG. 2A is a cross-sectional schematic of a semiconductor substrate, which is an embodiment of the semiconductor substrate of the camera of FIG. 1.

FIG. 2A is a cross-sectional schematic of a semiconductor substrate 210, which is an example of semiconductor substrate 110 of image sensor 100. The cross-section illustrated in FIG. 2A is parallel to a plane, hereinafter the x-z plane, formed by orthogonal directions 298X and 298Z, which are each orthogonal to direction 298Y. Herein, the x-y plane is formed by orthogonal directions 298X and 298Y, and planes parallel to the x-y plane are referred to as transverse planes. Unless otherwise specified, heights of objects herein refer to the object's extent in direction 298Z, or a direction 180° opposite thereto. Herein, reference to an axis x, y, or z or associated direction ±x, ±y, or ±z refers to directions 298X, 298Y, and 298Z respectively. Also, herein, a horizontal plane is parallel to the x-y plane, a width refers to an objects extension in the y direction, and vertical refers to the z direction.

Semiconductor substrate 210 has a bottom substrate surface 211 and a top substrate surface 219, each of which may be perpendicular to direction 298Z. Herein, top substrate surface 219 may be referred to as the front side surface of semiconductor substrate 210 and bottom substrate surface 211 may be referred to as the backside surface of semiconductor substrate 210. Herein, top substrate surface 219 may be referred as the non-illuminated surface of semiconductor substrate 210 and bottom substrate surface 211 opposite to top substrate surface 219 may be referred to as the illuminated surface of semiconductor substrate 210. Semiconductor substrate 210 includes a plurality of pixels 212 that form a pixel array 212A, which is an example of pixel array 112A. The plurality of pixels 212 are arranged in a plurality of rows and columns in directions 298X and 298Y respectively. Pixel array 212A has a pixel pitch 213 in direction 298X. In direction 298Y pixel array 212A has pitch $P_y$ that, in embodiments, equals pixel pitch 213. In embodiments, pixel pitch 213 is less than 1.1 µm, for example, pixel pitch 213 may equal 0.9 µm.

Figure 2B:
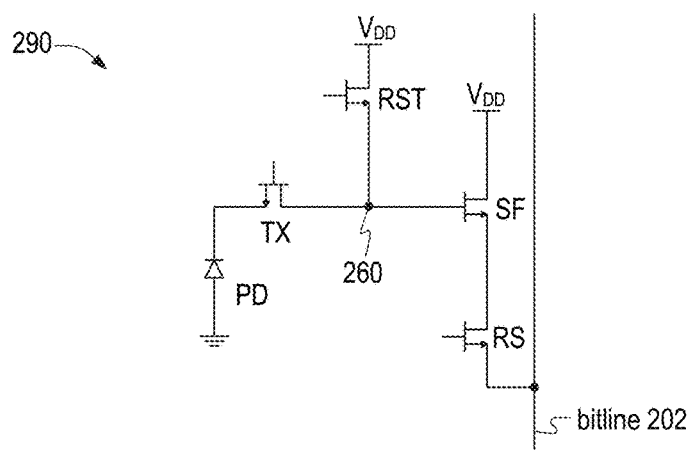
FIG. 2B is a circuit diagram of a four-transistor ("4T") pixel, which is an example pixel circuitry architecture of a pixel of FIG. 2A.

FIG. 2B is a circuit diagram of a four-transistor ("4T") pixel 290, which is a candidate pixel circuitry architecture of pixel 212. Pixel 290 includes a photodiode PD, a transfer transistor TX, a reset transistor RST, a source follower transistor SF, a row-select transistor RS. Pixel 290 is electrically connected to a bitline 202 of image sensor 100. FIGS. 2A and 2B are best viewed together in the following description.

Each pixel 212 includes a respective photodiode region 240 of a respective photodiode PD, a vertical transfer gate 280 of a respective transfer transistor (e.g., transfer transistor TX), and a respective floating diffusion region 260. Photodiode region 240 of each pixel 212 is configured to generate and accumulate charges in response to incident light thereon, for example entered from bottom substrate surface 211 of semiconductor substrate 210 (e.g., backside surface of semiconductor substrate 210) during an integration period of the image sensor 100. Electrical connection of photodiode region 240 to floating diffusion region 260 depends on voltage applied to vertical transfer gate 280. Charges, e.g., photoelectrons, accumulated in photodiode region 240 (e.g., source of transfer transistor TX), for example during an integration period of image sensor 100, can be selectively transferred to floating diffusion region 260 (e.g., drain of transfer transistor TX) depending on voltage applied to vertical transfer gate 280 of the transfer transistor (e.g., transfer transistor TX) associated with pixel 212. The photodiode region 240 may be in form of various configurations including pinned photodiode configuration, partially pinned photodiode configuration.

Each vertical transfer gate 280 of the transfer transistor (e.g., vertical gate portion of transfer transistor TX) is formed in a respective trench 220 formed by top substrate surface 219. Trench 220 includes side surfaces 219S and a bottom surface 219B.

Photodiode region 240 of each pixel 212 has a full well capacity that is related to the number of photoelectrons its photodiode region 240 can hold during an integration period. As photoelectrons generated exceed the full well capacity, pixel 212 becomes saturated and hence is not able to accommodate additional photoelectrons generated during the integration period. It is desirable for the excess photoelectrons generated in pixel 212 to tunnel through semiconductor substrate 210 to the nearest floating diffusion region 260, that is, the floating diffusion region associated with the pixel in which the photoelectrons were generated. However, when floating diffusion region 260 is disposed at a distance that is further away for the excess photoelectrons to reach within their lifetime or a time a photoelectron can move without recombining with a hole, the excess photoelectrons tunnel to an adjacent unsaturated pixel 212 and are collected by the adjacent pixel's photodiode region 240. This process results in blooming and hence degrades the quality of images generated by image sensor 100.

In embodiments, each pixel 212 is a four-transistor pixel or 4T pixel and further includes a reset transistor RST, a source follower transistor SF and a row select transistor RS. The reset transistor RST is coupled between a power line and the floating diffusion 260 to reset (e.g., discharge or charge floating diffusion 260 region to a preset voltage e.g., a supply voltage $V_{DD}$) under control of a reset signal during a reset period. The reset transistor RST is further coupled to photodiode region 240 of photodiode PD through the transfer transistor TX to selective reset photodiode region 240 to the preset voltage during the reset period. Floating diffusion region 260 is coupled to a gate of the source follower transistor SF. The source follower transistor is coupled between the power line and the row select transistor RS. The source follower transistor SF operates to modulate the image signal output based on the voltage of floating diffusion region 260 received, where the image signal corresponds to the amount photoelectrons accumulated in photodiode region 240 during the integration period at the gate thereof. The row select transistor RS selectively couples the output (e.g., image signal) of the source follower transistor RS to the readout column line (for example, bitline 202) under control of a row select signal.

In operation, during the integration period (also referred to as an exposure or accumulation period) of image sensor 100, photodiode region 240 of photodiode PD detects or absorbs light incident on pixel 212. During the integration period, the transfer transistor TX is turned off, i.e., the vertical transfer gate 280 of the transfer transistor TX receives a cut-off signal (e.g., a negative biasing voltage). The photogenerated charge accumulated in photodiode region 240 is indicative of the amount of light incident on photodiode region 240 of photodiode PD. After the integration period, the transfer transistor TX forms a conduction channel along the vertical transfer gate structure and transfers the photogenerated charge to floating diffusion region 260 through the conduction channel upon reception of a transfer signal (e.g., a positive biasing voltage) at vertical transfer gate 280. The source follower transistor SF generates the image signal. The row select transistor RS coupled to the source follower transistor then selectively reads out the signal onto a column bit line for subsequent image processing.

The disclosed vertical transfer gate structure may apply to any of a variety of additional or alternative types of pixel cell, e.g. a five-transistor pixel cell, or a six-transistor pixel cell and/or the like.

Figure 3:
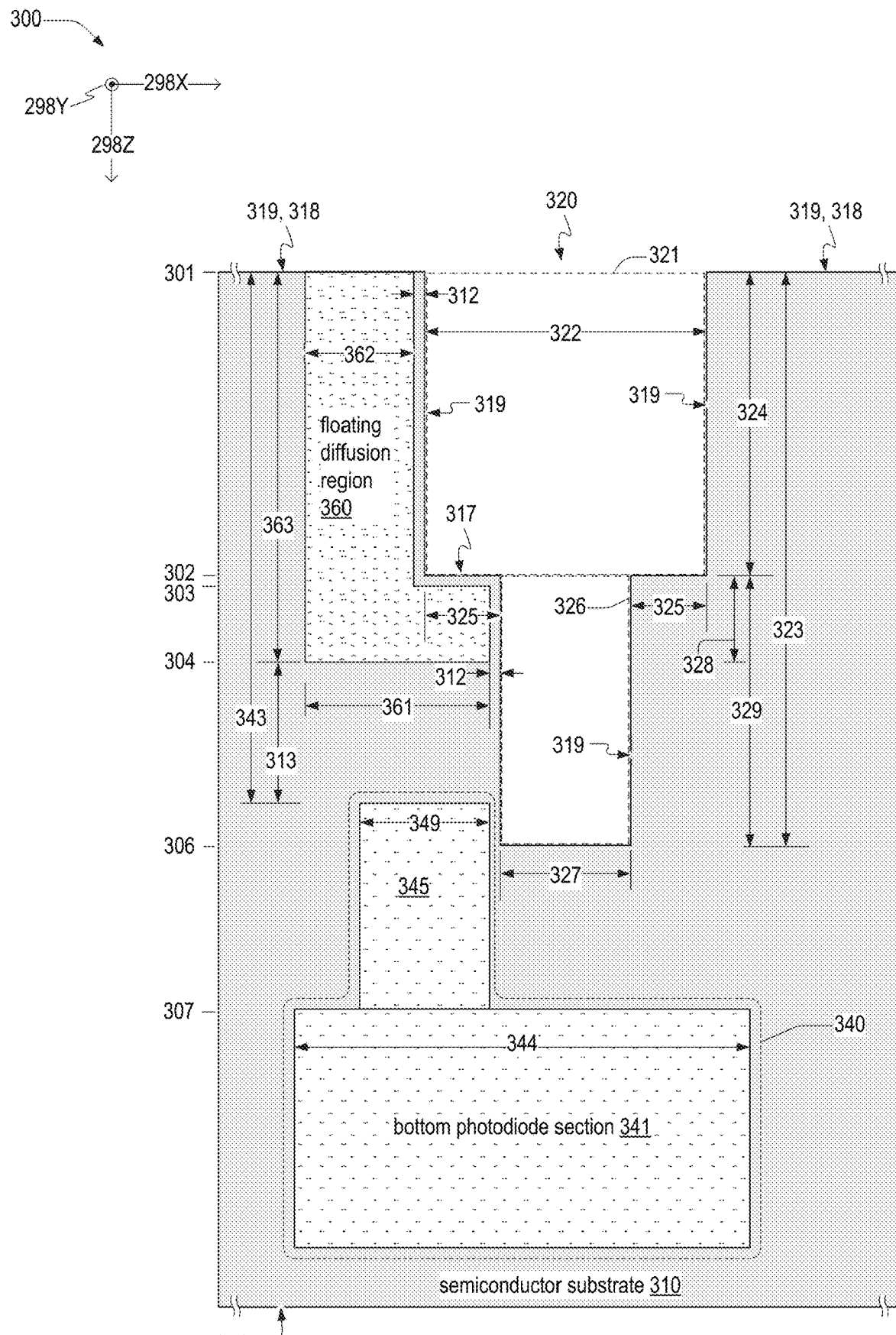
FIG. 3 is a cross-sectional schematic of a pixel, which is an example of a pixel formed in the semiconductor substrate of FIG. 2, in an embodiment.

FIG. 3 is a cross-sectional schematic of a pixel 300, which is an example of pixel 212. Pixel 300 is formed in a semiconductor substrate 310, which is an example of semiconductor substrate 210, A. Pixel 300 includes a trench 320 and, in semiconductor substrate 310, a floating diffusion region 360, and a photodiode region 340. FIG. 3 denotes transverse planes 301, 302, 303, 304, 306, and 307, each of which are parallel to the x-y plane. In embodiments, planes 302 and 303 are coplanar.

In embodiments, semiconductor substrate 310 is p-doped, photodiode region 340 is n-doped, and floating diffusion region 360 is $n^+$-doped. In embodiments, floating diffusion region 360 has a dopant concentration between $10^{19}$ and $5\times10^{20}$ charge carriers per cubic centimeter. In embodiments, semiconductor substrate 310 is a silicon bulk substrate doped with p-type dopants e.g., boron, and photodiode region 340 and floating diffusion region 360 are doped with n-type dopants e.g., arsenic, phosphors. However, it should be appreciated that the polarity may be reversed, for example, semiconductor substrate 310 may be n-type doped, while photodiode region 340 and floating diffusion region 360 are p-type doped regions in the semiconductor substrate 310.

Semiconductor substrate 310 has a substrate upper surface 319 and a substrate bottom surface 311 there opposite. Substrate upper surface 319 forms trench 320, which extends into semiconductor substrate 310 toward bottom surface 311 and has a trench depth 323 relative to a planar region 318 of substrate upper surface 319 surrounding the trench. Planar region 318 is in plane 301. Trench depth 323 defines the distance between transverse planes 301 and 306.

In the x-z plane and in direction 298X, trench 320 has an upper width 322 between plane 301 and a shallow-trench depth 324 that is less than trench depth 323. Shallow-trench depth 324 defines the distance between planes 301 and 302. Also in the x-z plane and in direction 298X, trench 320 has a lower width 327, between transverse planes 302 and 306 that is less than upper width 322. In embodiments, upper width 322 exceeds lower width by two times a width 325 denoted in FIG. 3, in which trench 320 is symmetric about a plane that is parallel to the y-z plane and bisects trench 320. In embodiments, trench 320 has the same dimensions in the y-z plane as it does in the x-z plane shown in FIG. 3. In embodiments, upper width 322 is determined by width 325 and lower width 327.

Trench 320 may be viewed as including two trenches: a wide trench 321 between planes 301 and 302, and a narrow trench 326 between planes 302 and 306. Wide trench 321 has width 322 and shallow-trench depth 324. Narrow trench 326 that has width 327 and a depth 329, which is shallow-trench depth 324 subtracted from trench depth 323.

Floating diffusion region 360 is disposed adjacent to trench 320, and extends away from planar region 318 to a junction depth 363. Junction depth 363 defines the distance between transverse planes 301 and 304, exceeds shallow-trench depth 324, and is less than the trench depth 323. In embodiments, junction depth 363 exceeds shallow-trench depth 324 by a distance 328, which is between ten nanometers and one hundred nanometers, a benefit of which is reduction in junction capacitance. However, when distance 328 is less than ten nanometers, the resistance between the conduction channel formed by the transfer transistor TX and floating diffusion region 360 increases, and hence impedes charge transfer. That is, photogenerated charge accumulated in photodiode region 340 may encounter barrier to transfer to the floating diffusion region 360 causing continuity issues resulting in image lag. Further, a risk of distance 328 exceeding one hundred nanometers is degraded conversion gain. Increasing distance 328 increases junction area between floating diffusion region 360 and the vertical transfer gate 480, which in turn increases junction capacitance, and thus degrade conversion gain.

Photodiode region 340 is an example of photodiode region 240, FIG. 2, and includes a lower photodiode section 341 beneath trench 320 and an upper photodiode section 345 adjacent to trench 320. Upper photodiode section 345 is formed at a photodiode depth 343, with respect to planar region 318, that is less than the trench depth 323, and extends toward bottom substrate surface 311 to transverse plane 307. Part of upper photodiode section 345 of photodiode region 340 is adjacent to narrow trench 326 of trench 320. Lower photodiode section 341 adjoins upper photodiode section 345 at horizontal plane 307 and extends away from planar region 318 toward bottom substrate surface 311. Lower photodiode section 341 has a width 344 that exceeds a width 349 of upper photodiode section 345.

Floating diffusion region 360 has an upper width 362 between transverse planes 301 and 303 and a lower width 361 between transverse planes 303 and 304. In embodiments, lower width 361 exceeds upper width 362. Substrate upper surface 319 includes a surface region 317 that is either coplanar with, or intersects, plane 302. Part of floating diffusion region 360 between planes 303 and 304 is between surface region 317 and upper photodiode section 345. In embodiments, floating diffusion region 360 formed directly above photodiode region 340 provides a blooming path therebetween such that excess photoelectrons generated in photodiode region 340 during an integration period are able to travel to floating diffusion region 360 within their lifetime, thus preventing blooming.

FIG. 3 denotes a thickness 312 in direction 298X of semiconductor substrate 310 between floating diffusion region 360 and substrate upper surface 319. Thickness 312 may range from zero to twenty nanometers. In embodiments, thickness 312 equals zero such that substrate upper surface 319 between planes 301 and 304 is a surface of floating diffusion region 360. A risk of thickness 312 exceeding twenty nanometers is increased junction capacitance, which degrades conversion gain.

In embodiments, a passivation implant region may be disposed in the space between floating diffusion region 360 and substrate upper surface 319, i.e., between floating diffusion region 360 and shallow trench with dielectric layer 450 (FIG. 4) or thickness 312, to passivate substrate upper surface 319 of trench 320 to reduce dark current noise associated with defects formed on the substrate upper surface 319 during formation of trench 320, for example during the etching of substrate upper surface 319 to form trench 320. In embodiments, the passivation implant region is formed by implanting p-type dopants (such as boron) for n-type photodiode on the substrate upper surface 319 into the region between floating diffusion region 360 and substrate upper surface 319. In embodiments, the passivation implant region is formed by implanting n-type dopants (such as arsenic, phosphorus) for p-type photodiode on the substrate upper surface 319 into the region between floating diffusion region 360 and substrate upper surface 319.

Figure 4:
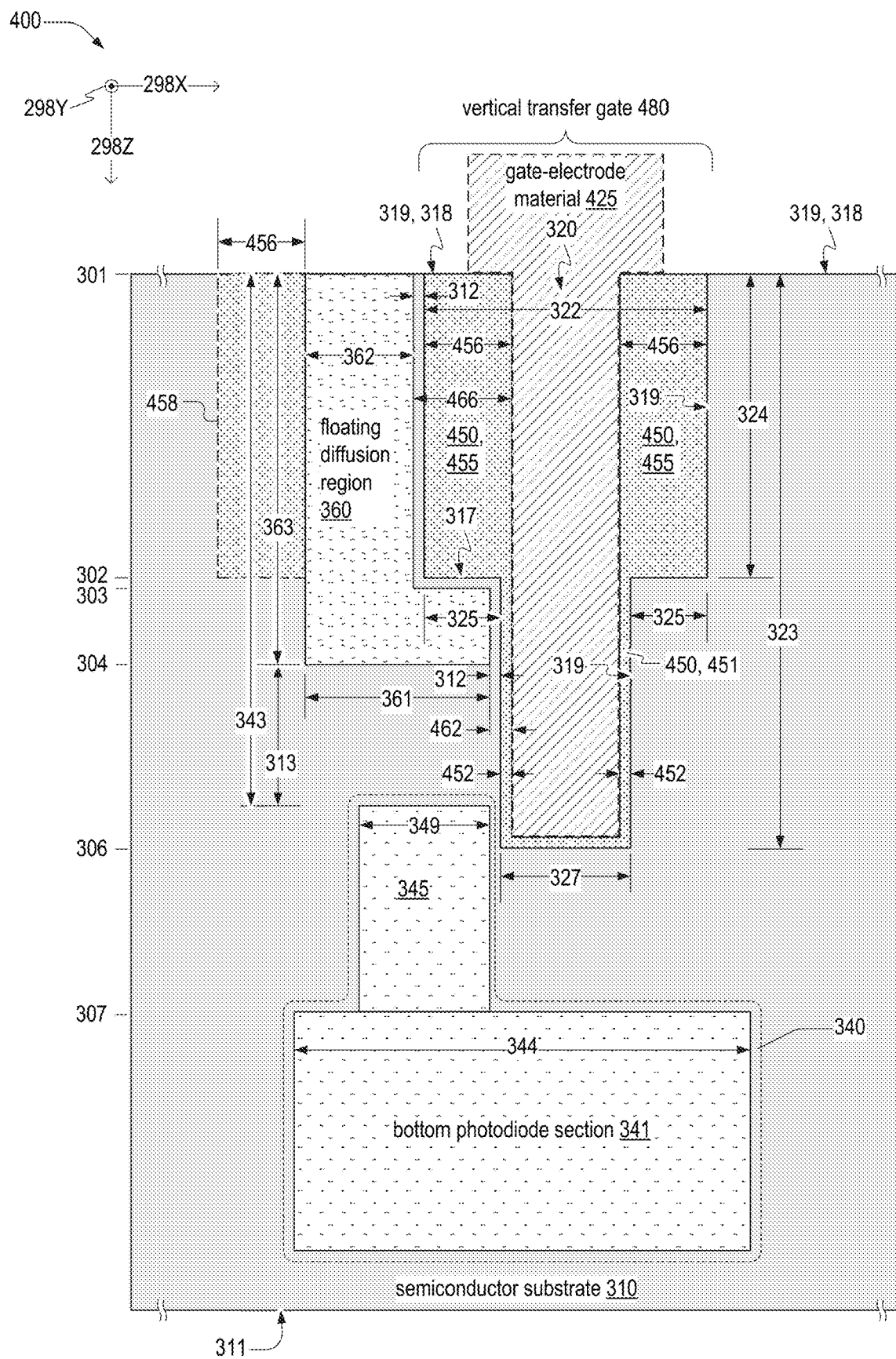
FIG. 4 is a cross-sectional view of the pixel of FIG. 3 with the addition of dielectric layer, in an embodiment.

FIG. 4 is a cross-sectional view of a pixel 400, which is pixel 300 with the addition of dielectric layer 450 that lines trench 320. Dielectric layer 450 may include at least one of a nitride material and an oxide material. Dielectric layer 450 includes a thin section 451 between planes 302 and 306, and a thick section 455 between planes 301 and 302. Thin section 451 and thick section 455 have respective widths 452 and 456 in direction 298X, where width 456 is greater than or equal to width 325, and width 452 is less than width 456. In embodiments, width 456 is the sum of width 325 and width 452.

In embodiments, pixel 400 also includes a dielectric region 458 between planes 301 and 302 and adjacent to floating diffusion region 360 such that floating diffusion region 360 is between dielectric region 458 and dielectric layer 450. Dielectric region 458 has width 456 and may be formed of the same material as dielectric layer 450.

In embodiments, pixel 400 includes a gate-electrode material 425 that fills trench 320 between planes 301 and 306. Gate-electrode material 425 may overfill trench 320 such that it extends above plane 301, as shown in FIG. 4. Gate-electrode material 425 may include at least one of polysilicon and a metal.

Distance 466 denotes a distance in direction 298X between floating diffusion region 360 and gate-electrode material 425 between planes 301 and 303. Distance 466 is greater than or equal to width 456. Distance 462 denotes a distance in direction 298X between floating diffusion region 360 and gate-electrode material 425 between planes 303 and 306. Distance 462 is greater than or equal to width 452 and less than distance 466. When thickness 312 equals zero, width 456 equals distance 466 and width 452 equals distance 462.

In embodiments, width 456 is between 0.1 and 0.4 μm and, to accommodate this width, upper width 322 may exceed lower width 327 by between 0.2 μm and 0.8 μm. In embodiments, shallow-trench depth 324 is greater than or equal to 0.1 μm; for example, shallow-trench depth 324 may be 0.25 μm and 0.30 μm. A technical benefit of these ranges of width 456 and shallow-trench depth 324, either individually or in combination, is to lower the capacitance of floating diffusion region 360 (junction capacitance), which increases pixel 400's conversation gain, and hence its sensitivity to small differences in photogenerated charges.

Trench 320, dielectric layer 450, and gate-electrode material 425 collectively form a vertical transfer gate 480, which is an example of vertical transfer gate 280, FIG. 2A Photodiode region 340, vertical transfer gate 480, and floating diffusion region 360 operate as a field-effect transistor of pixel 400 that has a gate length 313. Gate length 313 is a difference between photodiode depth 343 and junction depth 363. Appropriate choice of gate length 313 involves balancing a tradeoff between pixel blooming—when gate length 313 is too long—and punch-through between photodiode region 340 and floating diffusion region 360 when gate length 313 is too short. In embodiments, gate length 313 is between twenty nanometers and two hundred nanometers, which balances said tradeoff. In embodiments, width 452 is between two nanometers and ten nanometers such that the transfer transistor associated with vertical transfer gate 480 has an appropriate threshold voltage.

It is appreciated by those skilled in the art the effective capacitance of floating diffusion region 360 is related to conversion gain of the associated pixel, e.g., pixel 300. The larger the effective capacitance of floating diffusion region 360, the smaller the conversion gain of the associated pixel, hence the lower the dynamic range that the pixel can provide to the image signal output. The smaller the effective capacitance of floating diffusion region 360, the larger the conversion gain of the associated pixel, hence the higher the dynamic range that the pixel can provide to the image signal output.

Components that may contribute to the effective capacitance of floating diffusion region 360 include: (a) the junction capacitance between floating diffusion region 360 and the semiconductor substrate 310, (b) the junction capacitance between floating diffusion region 360 and vertical transfer gate 480, (c) the parasitic capacitance between floating diffusion region 360 and the gate of source follower transistor SF, (d) the parasitic capacitance between floating diffusion region 360 and the drain of reset transistor RST, and (e) the coupling capacitance between the metal contact connecting floating diffusion region 360 and the nearby metal contact (e.g., metal connect connecting to vertical transfer gate 480), wherein junction capacitances contribute the most to the overall effective capacitance of floating diffusion region 360. A shallow trench isolation structure with dielectric layer 450 separating floating diffusion region 360 and vertical transfer gate 480 can eliminate the junction capacitance between floating diffusion region 360 and vertical transfer gate 480, thus reducing the effective capacitance of floating diffusion region 360.

Dielectric region 458 also further lowers the junction capacitance by reducing the junction area between floating diffusion region 360 (e.g., n-type doped region) and surrounding semiconductor substrate 310 (e.g., p-type doped substrate).

In embodiments, lower photodiode section 341 photogenerates and accumulates photoelectrons and upper photodiode section 345 functions to transfer charges acuminated in the lower photodiode section 341 to a conduction channel formed by vertical transfer gate 480 of the transfer transistor when the transfer transistor is biased to turn on during change transfer operation.

In embodiments, floating diffusion region 360 and upper photodiode section 345 are on the same side of trench 320, as illustrated in FIG. 3. In such embodiments, part of floating diffusion region 360 is directly between the upper photodiode section 345 and thick section 455, which enables gate length 313 to be smaller than when floating diffusion region 360 and upper photodiode section 345 are on opposite sides of trench 320

In embodiments, trench depth 323 is between 0.2 μm and 0.7 μm. When trench depth 323 is too large, e.g., more than 0.7 μm, the bottom of trench 320 is too close to lower photodiode section 341, which results in increased white-pixel artifacts (from dark current) and reduced full-well capacity of photodiode region 340. When trench depth 323 is too small, e.g., less than 0.2 μm, shallow-trench depth 324 is too small, as described above, and the upper limit of gate length 313 is too far constrained such that vertical transfer gate 480 does not function properly.

FIG. 5 is a schematic cross-sectional view of part of an image sensor 590, which includes two adjacent pixels 500(1) and 500(2) in a semiconductor substrate 510. Semiconductor substrate 510 is an example of semiconductor substrate 310, and includes planar region 518, surface 519, and trenches 520(1, 2), which are examples planar region 318, surface 319, and trench 320, respectively. Pixels 300 and 400 are each examples of pixel 500. For example, when pixels 500 include a respective dielectric layer 450, each pixel 500 is equivalent to a respective pixel 400, and each may include at least one of dielectric layer 450 and gate-electrode material 425 in its trench 520.

Semiconductor substrate 510 includes a common floating diffusion 560 between trenches 520(1, 2). Common floating diffusion 560 functions as a floating diffusion region shared by both pixels 500(1) and 500(2). Each pixel 500 includes a respective photodiode region 340. Thickness 312 separates floating diffusion region 560 from surface 519 of trenches 520. As previously noted, thickness 312 may equal zero, in which case, floating diffusion region 560 spans semiconductor substrate 510 between trenches 520(1) and 520(2).

In the example illustrated by FIG. 5, sides of the common floating diffusion 560 are surrounded by dielectric layer 450, which reduces the junction area between common floating diffusion 560 and surrounding semiconductor substrate 510, thus minimizing the junction capacitance associated with common floating diffusion 560 to the junction capacitance formed between the bottom area of the common floating diffusion 560 and the semiconductor substrate 510. It should be appreciated that the effective capacitance of common floating diffusion 560 can be modulated by configuring the bottom width of the common floating diffusion 560 and the depth of shallow trench depth of trench 520(1, 2).

Excess photoelectrons generated by each respective photodiode region 340 during an integration period of image sensor 590 in the depicted pixel structure would travel to the common floating diffusion 560 through the anti-blooming path formed between each of the photodiode sections 340 and the common floating diffusion 560, instead to the nearby photodiode region 340 of adjacent pixel affecting the sensitivity of adjacent pixel as the effective distance between each respective photodiode region 340 and the common floating diffusion 560 is shorter than the distance to the nearby photodiode region 340 of adjacent pixel, as such blooming issue can be improved.

FIG. 6 is a cross-sectional view of an image sensor 690, which is an example of image sensor 590. FIG. 5 is a cross-sectional view of image sensor 690 in either cross-sectional plane 5A or 5B shown in FIG. 6. Image sensor 690 includes pixels 600(1-4), each of which is an example of pixel 500. Image sensor also includes dielectric layers 650 and a common floating diffusion region 660, which are respective examples of dielectric layers 450 and common floating diffusion region 560. The cross-sectional view of FIG. 6 is in a cross-sectional plane 6 shown in FIG. 5, and is parallel to the x-y plane.

FIG. 7 is a cross-sectional view of an image sensor 790, which is an example of image sensor 590. FIG. 5 is a cross-sectional view of image sensor 790 in cross-sectional plane 5C shown in FIG. 7. Image sensor 790 includes pixels 700(1-4), each of which is an example of pixel 500. Image sensor also includes a dielectric layer 750 and a common floating diffusion region 760, which are respective examples of dielectric layers 450 and common floating diffusion region 560. In image sensor 790, respective dielectric layers (e.g., layers 450 and 550) of adjacent pixels are connected to form dielectric layer 750 that surrounds common floating diffusion region 760. Dielectric layer 750 further lowers the junction capacitance of floating diffusion region 360 relative to dielectric layers 650. The cross-sectional view of FIG. 7 is in a cross-sectional plane 7 shown in FIG. 5, and is parallel to the x-y plane.

Figure 8:
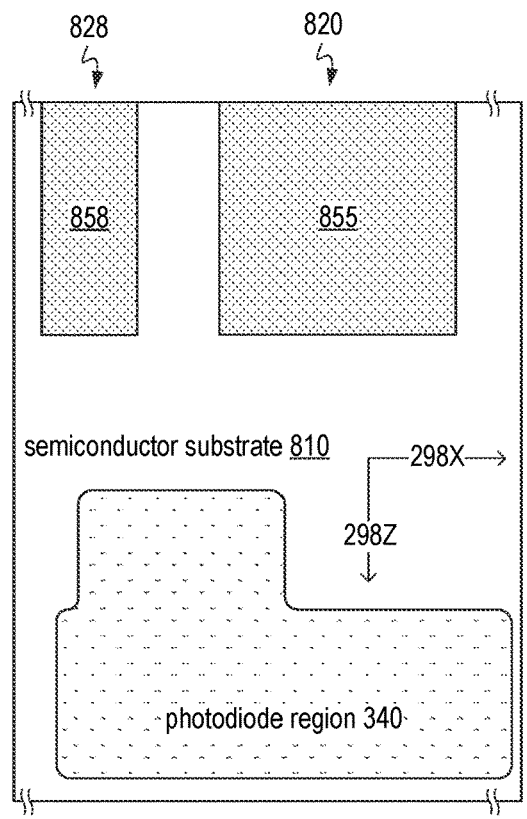
FIG. 8 is a cross-sectional schematic of a semiconductor substrate that includes shallow trenches, in an embodiment.

FIG. 8 is a cross-sectional schematic of a semiconductor substrate 810 that includes a shallow trench 820 and a shallow trench 828, which are filled with a dielectric 855 and a dielectric 858, respectively. In embodiment, semiconductor substrate 810 is photo-resist patterned and etched to form shallow trench 820 and shallow trench 828 in the semiconductor substrate 810. Subsequently, dielectric material is deposited filling shallow trench 820 and shallow trench 828. Semiconductor substrate 810 is an example of semiconductor substrate 310. Dielectric 855 is an example of thick section 455 of dielectric layer 450. Dielectric 858 in shallow trench 828 is similar to dielectric region 458.

Figure 9:
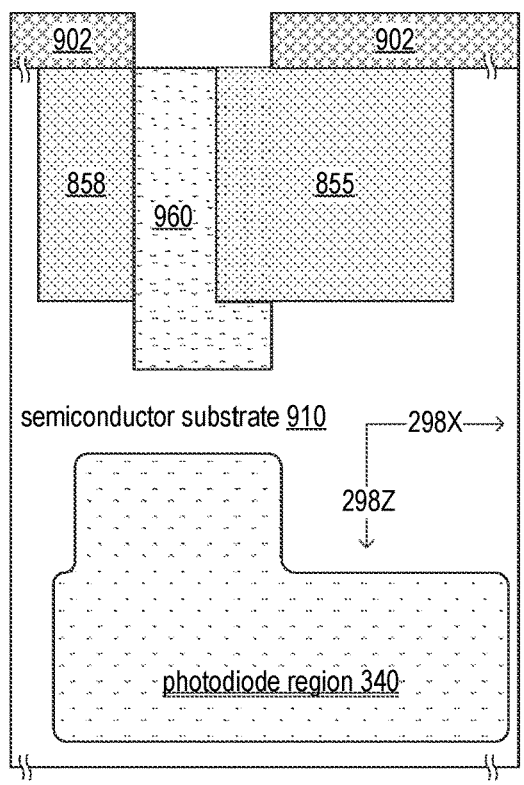
FIG. 9 is a cross-sectional schematic of the semiconductor substrate of FIG. 8, after formation of a floating diffusion region therein, in an embodiment.

FIG. 9 is a cross-sectional schematic of a semiconductor substrate 910, which is semiconductor substrate 810 after formation of a floating diffusion region 960 therein. FIG. 9 depicts a patterned hard mask 902 on semiconductor substrate 910 that defines transverse boundaries of floating diffusion region 960 during implantation thereof. Floating diffusion region 960 is an example of floating diffusion region 360, FIG. 3.

Figure 10:
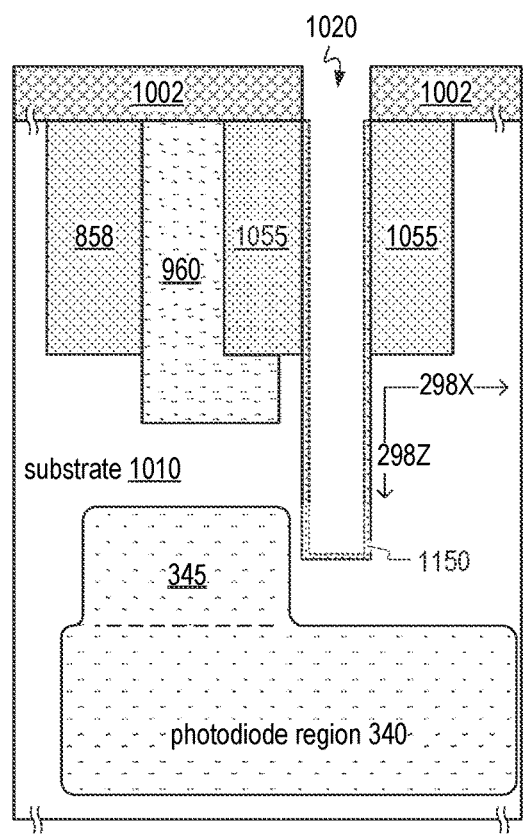
FIG. 10 is across-sectional schematic of the semiconductor substrate of FIG. 9 after formation of a deep trench therein, in an embodiment.

FIG. 10 is a cross-sectional schematic of a semiconductor substrate 1010, which is semiconductor substrate 910 after formation of a deep trench 1020 therein. Semiconductor substrate 1010 includes a thick dielectric section 1055, and the remainder of dielectric 855 after formation of deep trench 1020. Each dielectric section 1055 is an example of thick section 455, FIG. 4. FIG. 10 depicts a patterned hard mask 1002 on semiconductor substrate 1010 that defines transverse boundaries of deep trench 1020 during etching thereof. Deep trench 1020 may be formed by first etching dielectric 855 not covered by hard mask 1002, and then by etching semiconductor substrate 1010 therebeneath. In embodiments, semiconductor substrate 1010 includes a gate-oxide layer 1150 that lines deep trench 1020. Deep trench 1020 extends into semiconductor substrate 1010; part of deep trench 1020 is adjacent to upper photodiode section 345.

Figure 11:
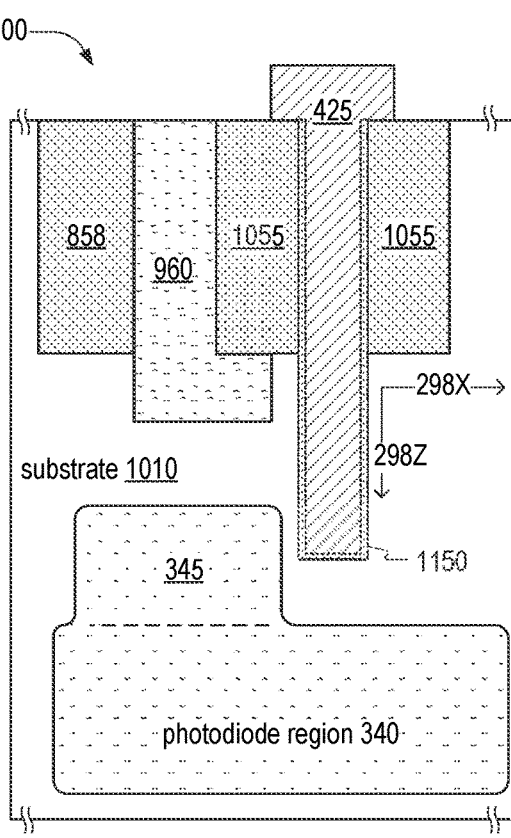
FIG. 11 is a cross-sectional schematic of a pixel, which is the semiconductor substrate of FIG. 10 after filling its deep trench with a gate-electrode material, in an embodiment.

FIG. 11 is a cross-sectional schematic of a pixel 1100, which is semiconductor substrate 1010 after filling deep trench 1020 with gate-electrode material 425. Pixel 1100 is an example of pixel 400.

Figure 12:
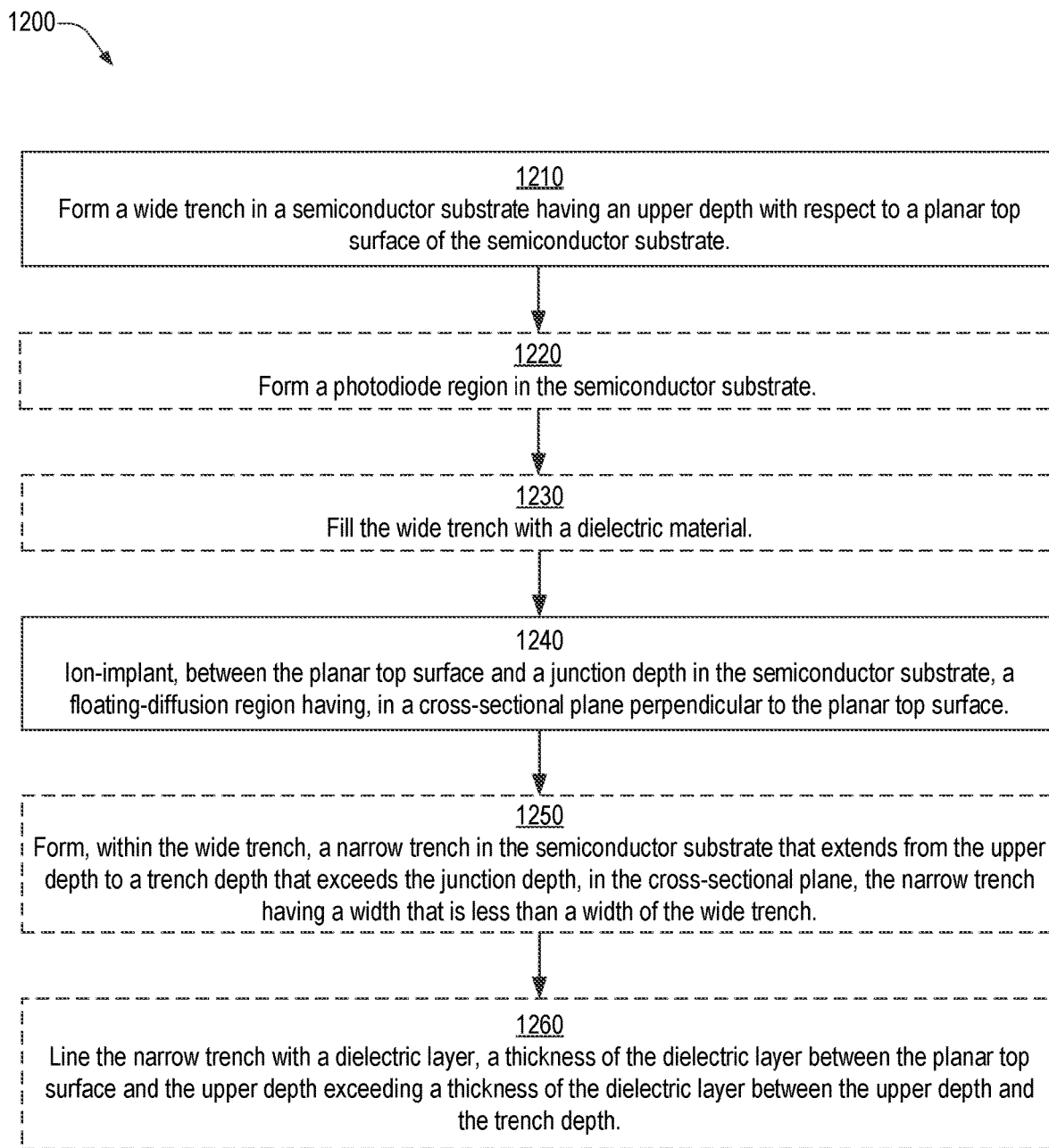
FIG. 12 is a flowchart illustrating a method for fabricating a pixel, in an embodiment.

FIG. 12 is a flowchart illustrating a method 1200 for fabricating a pixel, such as pixel 300. Method 1200 includes steps 1210 and 1240. In embodiments, method 1200 also includes at least one of steps 1220, 1230, 1250, and 1260.

Step 1210 includes forming a wide trench in a semiconductor substrate having an upper depth with respect to a planar top surface of the semiconductor substrate. In an example of step 1210, wide trench 321 is formed in semiconductor substrate 310, via an etching process for example.

Step 1220 includes forming a photodiode region in the semiconductor substrate. In embodiments, step 1220 follows step 1210, such that the photodiode region is formed after the formation of the wide trench. The photodiode region may be formed via ion implantation. In an example of step 1220, photodiode region 340 is formed in semiconductor substrate 310.

Step 1230 includes filling the wide trench with a dielectric material. In an example of step 1230, wide trench 321 is filled with the material that forms dielectric layer 450. Step 1230 may be executed before or after formation of narrow trench 326 and/floating diffusion region 360 in semiconductor substrate 310.

Step 1240 includes ion-implanting, between the planar top surface and a junction depth in the semiconductor substrate, a floating-diffusion region. The floating diffusion region has, in a cross-sectional plane perpendicular to the planar top surface, (i) an upper width between the planar top surface and the upper depth, and (ii) between the upper depth and the junction depth, a lower width that exceeds the upper width. Part of the floating-diffusion region is beneath the wide trench and between the upper depth and the junction depth. In an example of step 1240, floating diffusion region 360 is ion-implanted between planar region 318 and junction depth 363. In embodiments, step 1240 includes masking the semiconductor substrate with a patterned mask, such as patterned mask 902, FIG. 9.

In embodiments, step 1240 precedes at least one of steps 1210 and 1230. In embodiments, step 1240 follows at least one of steps 1210 and 1230. An advantage of step 1210 preceding step 1240 is that the doped semiconductor in the floating diffusion region has different etch rate than undoped parts of the semiconductor substrate. Hence, etching the wide trench after the ion-implantation of step 1240 is more difficult than etching before the ion-implantation of step 1240.

Step 1250 includes forming, within the wide trench, a narrow trench in the semiconductor substrate that extends from the upper depth to a trench depth that exceeds the junction depth. In the cross-sectional plane, the narrow trench has a width that is less than a width of the wide trench. In embodiments, step 1250 follows step 1230, such that part of the dielectric material filling the wide trench is removed, e.g. via dry etching, while forming the narrow trench. In an example of step 1250, narrow trench 326 is formed within wide trench 321.

Step 1260 includes lining the narrow trench with a dielectric layer, a thickness of the dielectric layer between the planar top surface and the upper depth exceeding a thickness of the dielectric layer between the upper depth and the trench depth. In an example of step 1260, narrow trench 326 is lined with dielectric layer 450 between planes 302 and 306, which yields pixel 400. In embodiments, narrow trench 326 is further deposited with conductive material, to form a vertical transfer gate e.g., vertical transfer gate 480.

Combinations of Features

Features described above as well as those claimed below may be combined in various ways without departing from the scope hereof. The following enumerated examples illustrate some possible, non-limiting combinations:

(A1) A pixel includes a semiconductor substrate, a floating diffusion region, and a photodiode region. The semiconductor substrate has a substrate upper surface forming a trench extending into the semiconductor substrate. The trench has a (i) trench depth relative to a planar region of the substrate upper surface surrounding the trench, and in a cross-sectional plane perpendicular to the planar region and in a direction parallel to the planar region (ii) an upper width between the planar region and an upper depth that is less than the trench depth, and (iii) a lower width, between the upper depth and the trench depth, that is less than the upper width. The floating diffusion region is in the semiconductor substrate, adjacent to the trench and extends away from the planar region to a junction depth, relative to the planar region, that exceeds the upper depth and is less than the trench depth. The photodiode region is in the semiconductor substrate and includes (i) a lower photodiode section beneath the trench and (ii) an upper photodiode section adjacent to the trench, beginning at a photodiode depth that is less than the trench depth, extending toward and adjoining the lower photodiode section.

(A2) In pixel (A1), in the cross-sectional plane, the floating diffusion region may have (i) an upper width between the planar region and the upper depth, and (ii) between the upper depth and the junction depth, a lower width that exceeds the upper width.

(A3) Any of pixels (A1) and (A2) may further include, when the upper width exceeds the lower width by a distance $2\Delta W$ in the cross-sectional plane, a dielectric layer lining the trench. In the cross-sectional plane in a transverse direction parallel to the planar region, the dielectric layer has (i) a thick section between the upper depth and the planar region having an upper width $W_u$ greater than or equal to $\Delta W$, and (ii) a thin section between the upper depth and the trench depth and having a lower width $W_l < W_u$. In the cross-sectional plane, part of the floating diffusion region is directly between the upper photodiode section and the thick section.

(A4) In pixel (A3), the upper width $W_u$ may be equal to $(W_l + \Delta W)$.

(A5) Any of pixels (A3) and (A4) may further include a dielectric region extending from the substrate upper surface to the junction depth and adjacent to the floating diffusion region, in which the floating diffusion region is between the trench and the dielectric region.

(A6) In any of pixels (A3)-(A5), in an additional cross-sectional plane parallel to the planar region and between the planar region and the upper depth, the dielectric layer may surround the trench.

(A7) Any of pixels (A3)-(A6) may further include a gate-electrode material filling the trench; the trench, the dielectric layer, and the gate-electrode material forming a vertical transfer gate electrically connected to the photodiode region.

(A8) In pixel (A7) between the planar region and the upper depth, a distance $d_u$ between the floating diffusion region and the gate-electrode material may be greater than or equal to upper width $W_u$, and between the upper depth and the trench depth, a distance $d_l$ between the floating diffusion region and the gate-electrode material may satisfy $W_l \le d_l < W_u$ and $d_l < d_u$.

(A9) In any of pixels (A1)-(A8), the upper width may exceed the lower width by between 0.2 μm and 0.8 μm.

(A10) In any of pixels (A1)-(A9), the trench depth may be between 0.2 μm and 0.7 μm.

(A11) In any of pixels (A1)-(A10), the junction depth may exceed the upper depth by between ten nanometers and one hundred nanometers.

(A12) In any of pixels (A1)-(A11), the photodiode depth may exceed the junction depth by between twenty nanometers and two hundred nanometers.

(A13) In any of pixels (A1)-(A12), the upper depth may be greater than or equal to 0.1 μm.

(B1) An image sensor includes a first instance of any of the pixel (A1)-(A13); and a second instance of any of the pixel (A1)-(A13) in the semiconductor substrate of, and adjacent to, the first instance. The floating diffusion region of the first instance and the floating diffusion region of the second instance are part of a common floating diffusion region, at least part of which is between the first instance and the second instance.

(C1) An image sensor includes a first instance of any of the pixel (A3)-(A13); and a second instance of any of the pixel (A3)-(A13) in the semiconductor substrate of, and adjacent to, the first instance. The floating diffusion region of the first instance and the floating diffusion region of the second instance are part of a common floating diffusion region, at least part of which is between the first instance and the second instance. The common floating diffusion region spans a region of the semiconductor substrate between the respective dielectric layers between the first instance and the second instance.

(C2) In pixel (C1), the dielectric layer of the first instance and the dielectric layer of the second instance may be part of a common a dielectric layer, at least part of which is between the trench of the first instance and the trench of the second instance.

(D1) A method for forming a pixel includes forming a wide trench in a semiconductor substrate and ion-implanting a floating-diffusion region in the semiconductor substrate between the planar top surface and a junction depth in the semiconductor substrate. The wide trench has an upper depth with respect to a planar top surface of the semiconductor substrate. The floating-diffusion region has, in a cross-sectional plane perpendicular to the planar top surface, (i) an upper width between the planar top surface and the upper depth, and (ii) between the upper depth and the junction depth, a lower width that exceeds the upper width. Part of the floating-diffusion region is beneath the wide trench and between the upper depth and the junction depth.

(D2) Method (D1) may further include filling the wide trench with a dielectric material.

(D3) Any one of methods (D1) and (D2) may further include forming, within the wide trench, a narrow trench in the semiconductor substrate that extends from the upper depth to a trench depth that exceeds the junction depth. In the cross-sectional plane, the narrow trench having a width that is less than a width of the wide trench.

(D4) Method (D3) may further include lining the narrow trench with a dielectric layer, a thickness of the dielectric layer between the planar top surface and the upper depth exceeding a thickness of the dielectric layer between the upper depth and the trench depth.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A pixel comprising:
    a semiconductor substrate having a substrate upper surface forming a trench extending into the semiconductor substrate and having (i) a trench depth relative to a planar region of the substrate upper surface surrounding the trench, and in a cross-sectional plane perpendicular to the planar region and in a direction parallel to the planar region (ii) an upper width between the planar region and an upper depth that is less than the trench depth, and (iii) a lower width, between the upper depth and the trench depth, that is less than the upper width;
    a floating diffusion region that
        (i) is in the semiconductor substrate, adjacent to the trench,
        (ii) extends away from the planar region to a junction depth, relative to the planar region, that exceeds the upper depth and is less than the trench depth, and
        (iii) has, in the cross-sectional plane, (a) an upper width between the planar region and the upper depth, and (b) between the upper depth and the junction depth, a lower width that exceeds the upper width; and
    a photodiode region in the semiconductor substrate and including (i) a lower photodiode section beneath the trench and (ii) an upper photodiode section adjacent to the trench, beginning at a photodiode depth that is less than the trench depth, extending toward and adjoining the lower photodiode section.

2. The pixel of claim 1, the upper width exceeding the lower width by a distance $2\Delta W$ in the cross-sectional plane, and further comprising:
    a dielectric layer lining the trench and, in the cross-sectional plane in a transverse direction parallel to the planar region, having (i) a thick section between the upper depth and the planar region having an upper width $W_u$ greater than or equal to $\Delta W$, and (ii) a thin section between the upper depth and the trench depth and having a lower width $W_l < W_u$, in the cross-sectional plane, part of the floating diffusion region being directly between the upper photodiode section and the thick section.

3. The pixel of claim 2, the upper width $W_u$ being equal to $(W_l + \Delta W)$.

4. The pixel of claim 2, further comprising a dielectric region extending from the substrate upper surface to the junction depth and adjacent to the floating diffusion region, which is between the trench and the dielectric region.

5. The pixel of claim 2, in an additional cross-sectional plane parallel to the planar region and between the planar region and the upper depth, the dielectric layer surrounding the trench.

6. The pixel of claim 2, further comprising a gate-electrode material filling the trench; the trench, the dielectric layer, and the gate-electrode material forming a vertical transfer gate electrically connected to the photodiode region.

7. The pixel of claim 6, between the planar region and the upper depth, a distance $d_u$ between the floating diffusion region and the gate-electrode material being greater than or equal to upper width $W_u$, and between the upper depth and the trench depth, a distance $d_l$ between the floating diffusion region and the gate-electrode material satisfying $W_l \leq d_l < W_u$ and $d_l < d_u$.

8. The pixel of claim 1, the upper width exceeding the lower width by between 0.2 μm and 0.8 μm.

9. The pixel of claim 1, the trench depth being between 0.2 μm and 0.7 μm.

10. The pixel of claim 1, the junction depth exceeding the upper depth by between ten nanometers and one hundred nanometers.

11. The pixel of claim 1, the photodiode depth exceeding the junction depth by between twenty nanometers and two hundred nanometers.

12. The pixel of claim 1, further comprising a passivation implant region surrounding the trench and located between the trench and floating diffusion region.

13. An image sensor comprising:
a plurality of pixels of claim 1, including a first pixel and a second pixel adjacent thereto, each disposed in the semiconductor substrate;
the floating diffusion region of the first pixel and the floating diffusion region of the second pixel being part of a common floating diffusion region, at least part of which is between the first pixel and the second pixel.

14. An image sensor comprising:
a plurality of the pixels of claim 2, including a first pixel and a second pixel adjacent thereto, each disposed in the semiconductor substrate;
the floating diffusion region of the first pixel and the floating diffusion region of the second pixel being part of a common floating diffusion region, at least part of which is between the first pixel and the second pixel;
the common floating diffusion region spanning a region of the semiconductor substrate between the respective dielectric layers between the first pixel and the second pixel;
the dielectric layer of the first pixel and the dielectric layer of the second pixel being part of a common a dielectric layer, at least part of which is between the trench of the first pixel and the trench of the second pixel.

15. A pixel comprising:
a semiconductor substrate having a substrate upper surface forming a trench extending into the semiconductor substrate and having (i) a trench depth relative to a planar region of the substrate upper surface surrounding the trench, and in a cross-sectional plane perpendicular to the planar region and in a direction parallel to the planar region (ii) an upper width between the planar region and an upper depth that is less than the trench depth, and (iii) a lower width, between the upper depth and the trench depth, that is less than the upper width by a distance $2\Delta W$ in the cross-sectional plane;
a floating diffusion region in the semiconductor substrate, adjacent to the trench and extending away from the planar region to a junction depth, relative to the planar region, that exceeds the upper depth and is less than the trench depth;
a photodiode region in the semiconductor substrate and including (i) a lower photodiode section beneath the trench and (ii) an upper photodiode section adjacent to the trench, beginning at a photodiode depth that is less than the trench depth, extending toward and adjoining the lower photodiode section; and
a dielectric layer lining the trench and, in the cross-sectional plane in a transverse direction parallel to the planar region, having (i) a thick section between the upper depth and the planar region having an upper width $W_u$ greater than or equal to $\Delta W$, and (ii) a thin section between the upper depth and the trench depth and having a lower width $W_l < W_u$,
in the cross-sectional plane, part of the floating diffusion region being directly between the upper photodiode section and the thick section.

* * * * *